US012642106B2

(12) United States Patent
Nguyen et al.

(10) Patent No.: US 12,642,106 B2
(45) Date of Patent: May 26, 2026

(54) SMALL OUTLINE TRANSISTOR WITH THERMAL FLAT LEAD

(71) Applicant: Texas Instruments Incorporated, Dallas, TX (US)

(72) Inventors: Hau Nguyen, San Jose, CA (US); Ashok Prabhu, San Jose, CA (US); Kurt Sincerbox, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 697 days.

(21) Appl. No.: 17/887,790

(22) Filed: Aug. 15, 2022

(65) Prior Publication Data

US 2024/0055331 A1     Feb. 15, 2024

(51) Int. Cl.
| | |
|---|---|
| *H01L 23/495* | (2006.01) |
| *H10W 70/04* | (2026.01) |
| *H10W 70/40* | (2026.01) |
| *H10W 74/01* | (2026.01) |
| *H10W 74/10* | (2026.01) |
| *H10W 72/00* | (2026.01) |
| *H10W 72/50* | (2026.01) |
| *H10W 74/00* | (2026.01) |
| *H10W 90/00* | (2026.01) |

(52) U.S. Cl.
CPC ....... *H10W 70/461* (2026.01); *H10W 70/048* (2026.01); *H10W 70/417* (2026.01); *H10W 70/438* (2026.01); *H10W 70/481* (2026.01);

*H10W 74/014* (2026.01); *H10W 74/016* (2026.01); *H10W 74/121* (2026.01); *H10W 72/536* (2026.01); *H10W 72/884* (2026.01); *H10W 74/00* (2026.01); *H10W 90/736* (2026.01); *H10W 90/756* (2026.01)

(58) Field of Classification Search
CPC ......... H01L 29/42392; H01L 23/49555; H01L 23/49548; H01L 23/49551
See application file for complete search history.

(56) References Cited

U.S. PATENT DOCUMENTS

| | | | |
|---|---|---|---|
| 10,854,538 B2 | 12/2020 | Ko et al. | |
| 2019/0295939 A1 | 9/2019 | Ko et al. | |
| 2021/0020549 A1 | 1/2021 | Chien et al. | |
| 2021/0104471 A1* | 4/2021 | Rafael, Jr. ............. | H01L 21/565 |
| 2021/0398882 A1* | 12/2021 | Thompson .............. | H01L 21/56 |

* cited by examiner

*Primary Examiner* — Yu-Hsi D Sun
(74) *Attorney, Agent, or Firm* — Ronald O. Neerings; Frank D. Cimino

(57)     ABSTRACT

An electronic device includes a die attach pad, a semiconductor die, a lead, a package structure, and tie bars, where the die attach pad has opposite first and second sides, the semiconductor die is attached to the second side of the die attach pad, the lead has a first portion connected to a circuit of the semiconductor die by a bond wire, the package structure exposes a portion of the first side of the die attach pad and the second portion of the lead. Four tie bars extend outward from the die attach pad and the tie bars have respective ends exposed outside the package structure.

25 Claims, 16 Drawing Sheets

200

202 — PROVIDE/CREATE STARTING LEAD FRAME PANEL ARRAY WITH ROWS AND COLUMNS OF UNIT REGIONS HAVING A DIE ATTACH PAD WITH RAMPED CORNER LOCKING FEATURES AND LEADS WITH RAMPED LEAD LOCKING FEATURES

204 — DIE ATTACH

206 — ELECTRICAL CONNECTION

208 — MOLDING

210 — PACKAGE SEPARATION

SMALL OUTLINE TRANSISTOR WITH THERMAL FLAT LEAD

BACKGROUND

Small outline transistors (SOTs) can suffer from thermal effects, for example, in high voltage switching applications when operating at high switching frequencies. Thermal performance can be improved by exposed thermal pads, but this can increase production costs using expensive material, expensive low density etched lead frame strips to create mold locking feature, and complex process flows such as a dedicated mold tool with single unit molds for package designs which can change I/O, lead pitch, and other features.

SUMMARY

In one aspect, an electronic device includes a die attach pad with opposite first and second sides, a semiconductor die attached to the second side of the die attach pad, a lead, and a package structure. The lead has first and second portions, the first portion connected to a circuit of the semiconductor die. The package structure encloses the bond wire, a portion of the semiconductor die, and a portion of the second side of the die attach pad, and the package structure exposes a portion of the first side of the die attach pad, and the second portion of the lead. The electronic device includes four tie bars that extend outward from the die attach pad, and the tie bars have respective ends exposed outside the package structure.

In another aspect, a method includes attaching a semiconductor die to a die attach pad of a given unit region of a lead frame panel array having rows and columns of unit regions, each unit region including a die attach pad with opposite ends, two tie bars connected to each end of the die attach pad along a column direction, and a lead. The method further includes electrically connecting a circuit of the semiconductor die to the lead of the given unit region, performing a molding process that forms molded structures enclosing portions of the unit regions along the columns and exposing bottom sides of the die attach pads of the unit regions, and separating packaged electronic devices from the lead frame panel array to expose cut ends of the two tie bars along opposite cut ends of a package structure.

In a further aspect, a lead frame panel array includes unit regions arranged in rows along a first direction and columns along an orthogonal second direction, each unit region including a die attach pad with opposite ends, two tie bars connected to each end of the die attach pad along a column direction, and a lead, where each die attach pad has opposite first and second sides, the two tie bars of neighboring unit regions are joined together, and each lead has a first portion and a second portion, the first portion spaced apart from a plane of the first side of the die attach pad, and the second portion having a bottom along the plane of the first side of the die attach pad.

DETAILED DESCRIPTION

Figure 1:
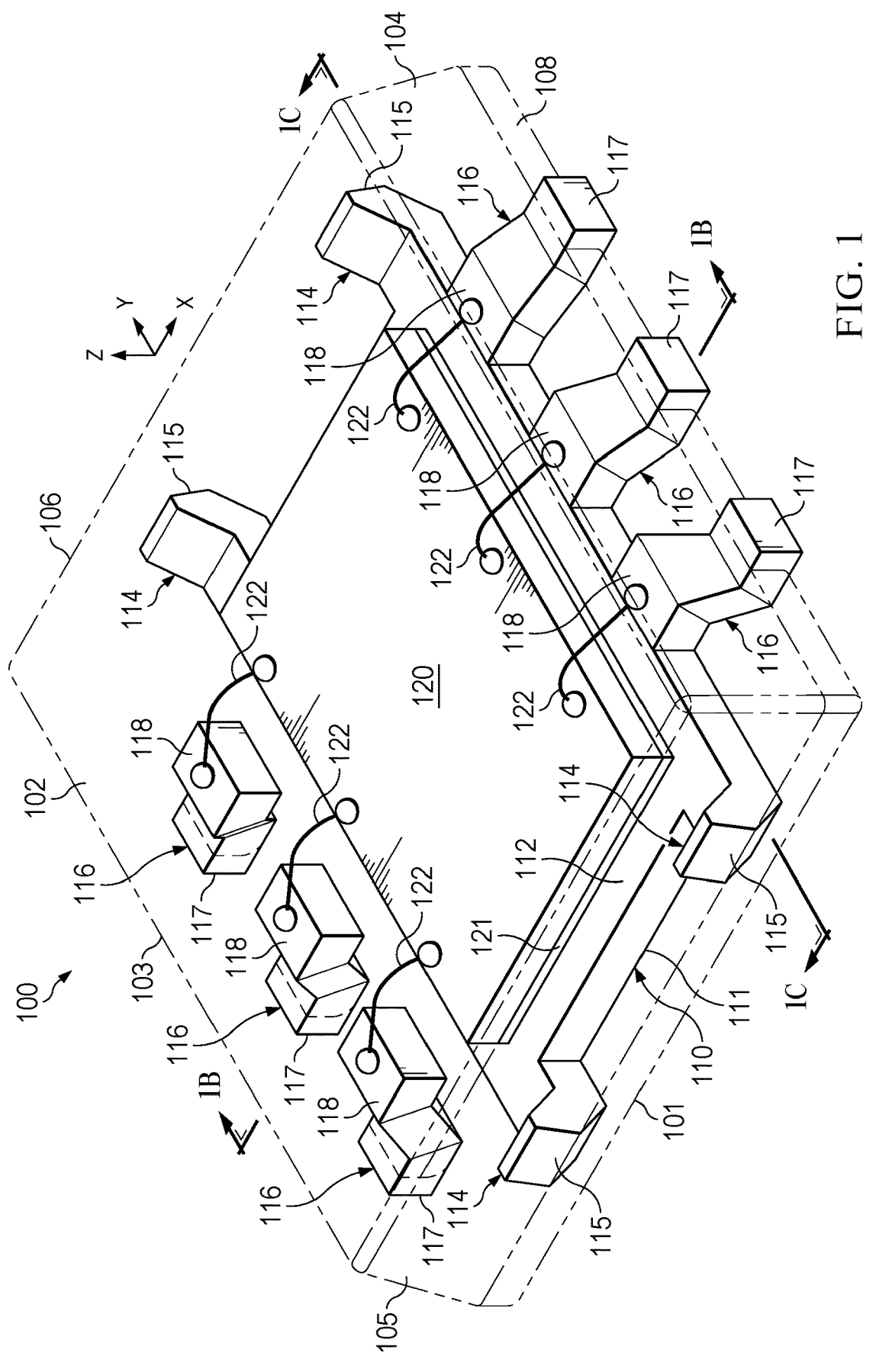
FIG. 1 is a top perspective view of an electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
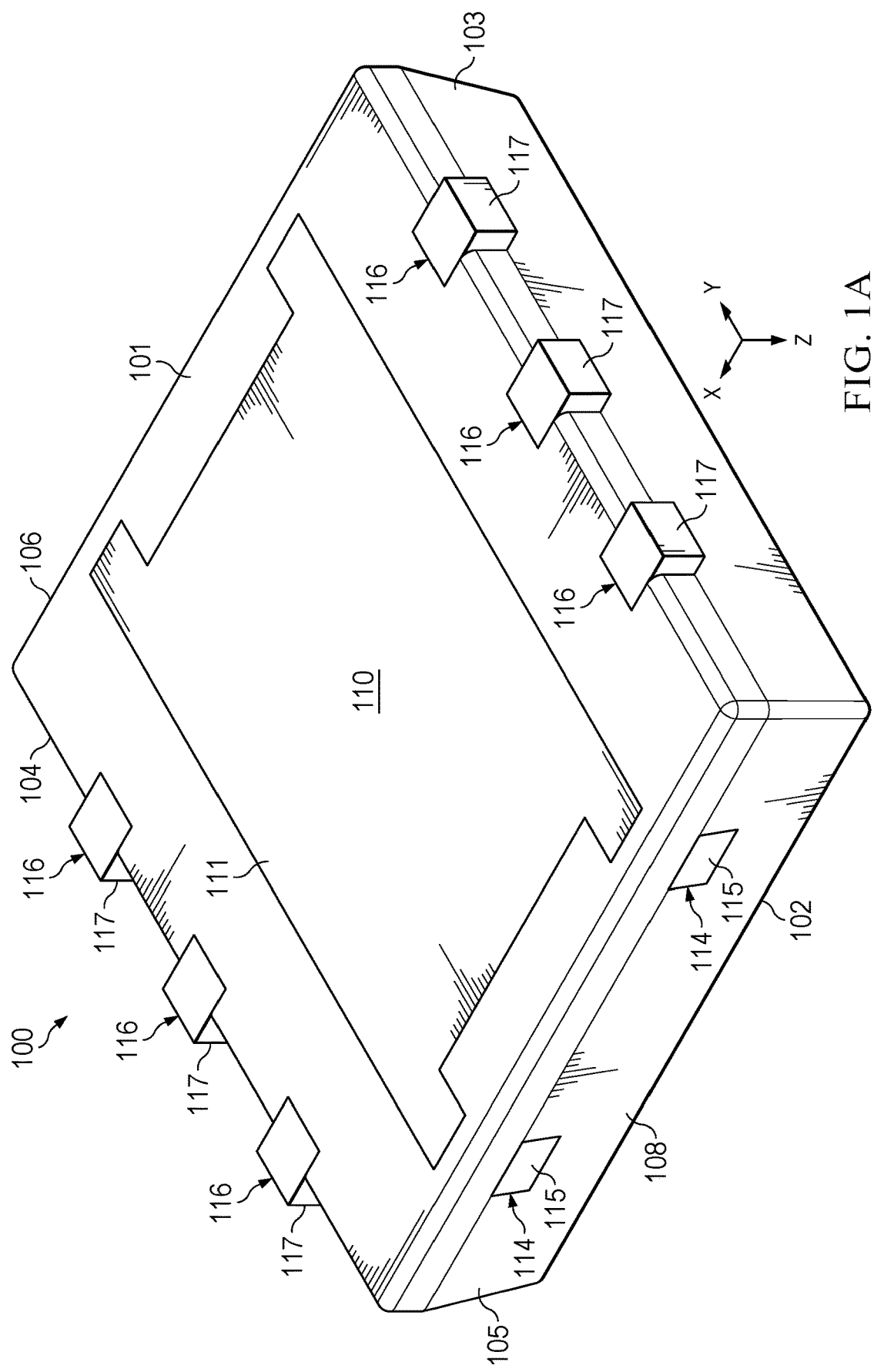
FIG. 1A is a bottom perspective view of the electronic device of FIG. 1.
Figure 1B:
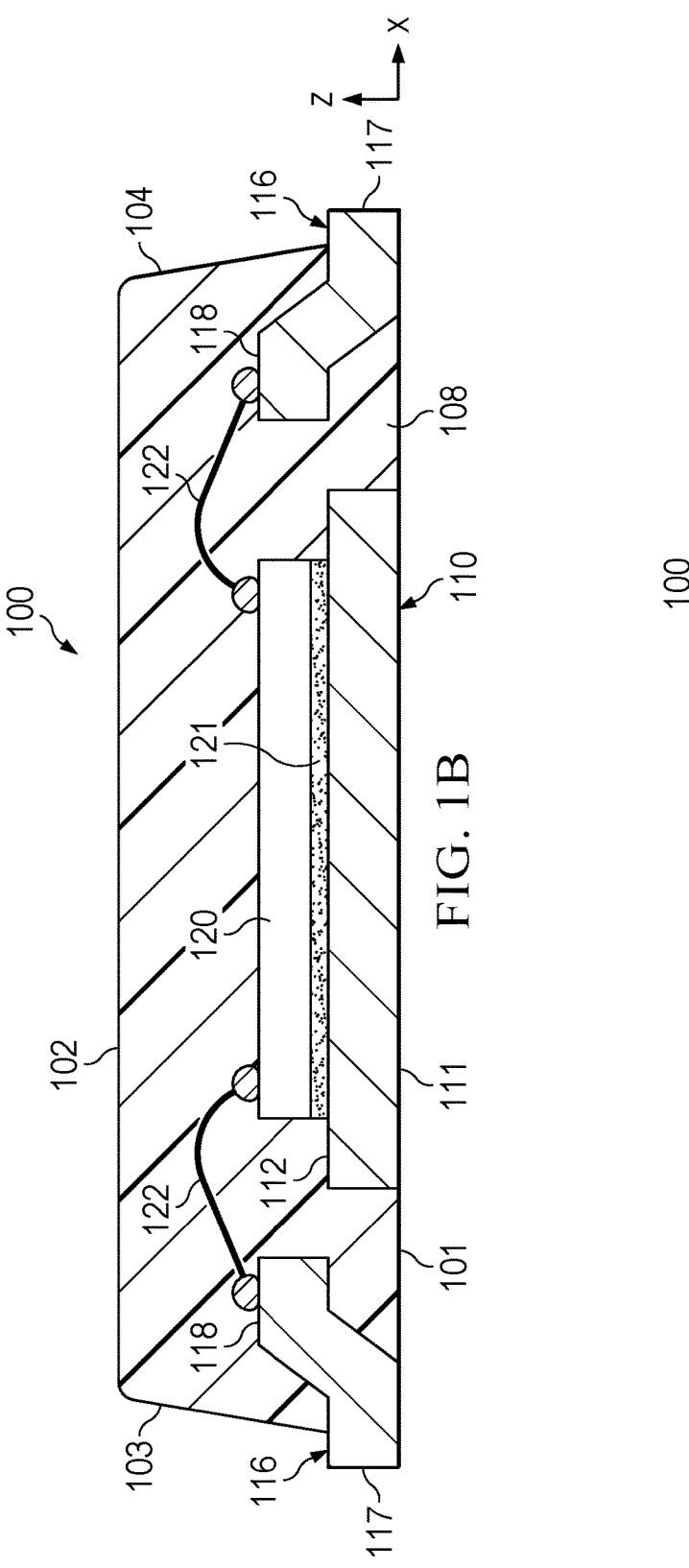
FIG. 1B is a partial sectional side elevation view taken along line 1B-1B of FIG. 1.
Figure 1C:
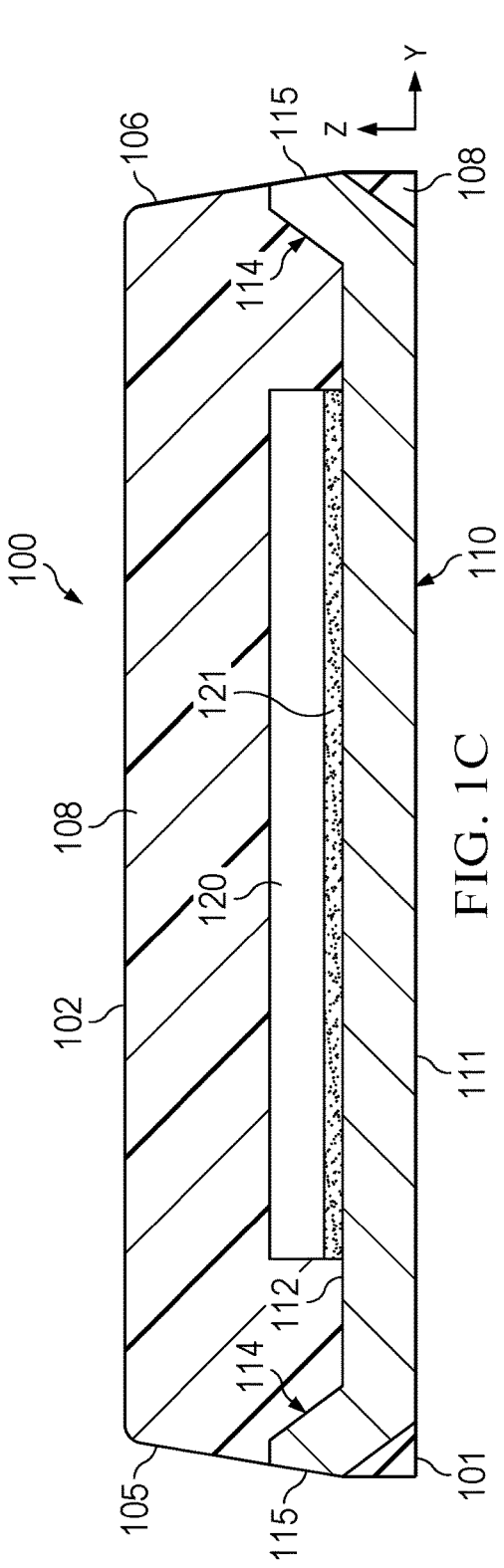
FIG. 1C is a partial sectional side elevation view taken along line 1C-1C of FIG. 1.

FIGS. 1-1C show an electronic device 100. The electronic device 100 in one example is a packaged small outline transistor (SOT). In another example, the electronic device 100 is an integrated circuit having multiple electronic components. FIG. 1 shows a top perspective view of the electronic device 100, FIG. 1A shows a bottom perspective view of the electronic device 100, FIG. 1B shows a partial sectional side elevation view taken along line 1B-1B of FIG. 1, and FIG. 1C shows a partial sectional side elevation view taken along line 1C-1C of FIG. 1. The electronic device 100 is shown in FIGS. 1-1C in an example position or orientation in a three-dimensional space with a first direction X, and a perpendicular (orthogonal) second direction Y, and a third direction Z that is perpendicular (orthogonal) to the respective first and second directions X and Y, and structures or features along any two of these directions are orthogonal to one another. As best shown in FIGS. 1 and 1A, the electronic device 100 has a package structure 108 with opposite first and second (e.g., bottom and top) sides 101 and 102, respectively, which are spaced apart from one another along the third direction Z. The package structure also has laterally opposite third and fourth sides 103 and 104 spaced apart from one another along the first direction X, and opposite fifth and sixth sides 105 and 106 spaced apart from one another along the second direction Y in the illustrated orientation. The package sides 101-106 in one example have substantially planar outer surfaces. In other examples, one or more of the sides 101-106 have curves, angled features or other non-planar surface features.

The electronic device 100 includes a die attach pad 110 with a first (e.g., bottom) side 111 exposed along the first side of the package structure 108. The die attach pad 110 has an opposite second side 112 enclosed by the package structure 108. The die attach pad 110 in one example is or includes a conductive metal, for example aluminum or copper or alloys that include copper or aluminum, and the die attach pad 110 provides good thermal heat dissipation. The good thermal conductivity of the exposed die attach pad 110 is beneficial for SOT devices having transistors operating at high voltages and/or frequencies, where the die attach pad 110 can help extract heat away from a transistor or other component or components of the electronic device during powered operation.

The electronic device includes first, second, third, and fourth tie bars 114 that extend outward from the die attach pad 110. The tie bars 114 have respective ends 115 that are exposed outside the package structure 108. The ends 115 of the tie bars 114 in one example are formed by cutting operations during packaged separation that cut through columns of molded structures to form the sides 105 and 106 and concurrently cut through tie bars that connect neighboring unit regions of a starting lead frame panel array. The electronic device 100 in FIGS. 1-1C has two tie bars 114 connected to each end of the die attach pad 110 and extending along the second direction Y. In this example, first and second tie bars 114 have cut ends 115 exposed along the fifth side 105, and third and fourth tie bars 114 have cut ends 115 exposed along the sixth side 106. In another example, more than two tie bars 114 extend from an end of the die attach pad 110 to one or both of the fifth and sixth sides 105 and 106. In these or other implementations, one or more of the tie bars 114 extend from the respective end of the die attach pad 110 to the respective side 105 or 106 at a non-zero angle to the second direction Y. In these or further implementation, the tie bars 114 extend outward from respective corners of the die attach pad 110, for example, as shown in FIGS. 1 and 1A.

As best shown in FIGS. 1 and 1C, the illustrated tie bars 114 have a down set structure or shape. In this example, the first and second tie bars 114 extend outward from respective first and second corners of the die attach pad 110 and toward the fifth side 105 of the package structure 108 along the second direction Y, and the first and second tie bars 114 extend away from the plane of the first side 111 of the die attach pad 110. The third and fourth tie bars 114 extend outward from respective third and fourth corners of the die attach pad 110 and toward the sixth side 106 of the package structure 108 along the second direction Y, and the third and fourth tie bars 114 extend upward and away from the plane of the first side 111 of the die attach pad 110. In the illustrated implementation, the cut ends 115 of the tie bars 114 are spaced apart from a plane of the bottom side 111 of the die attach pad 110.

The down set tie bar shape in certain examples can provide mold locking advantages to mitigate molded material delamination in operation of the electronic device 100. In addition, the down set structure of the tie bars 114 helps apply counter force downward along the third direction to keep the bottom side 111 of the die attach pad 110 engaged to a bottom mold half during package molding to mitigate or prevent over mold occurrences in which molding compound extends onto the bottom side 111 of the die attach pad 110. Mitigating over mold occurrences facilitates heat removal through the bottom side 111 of the die attach pad 110 during powered device operation. In combination, the positioning of some or all the tie bars 114 at or near the corners of the die attach pad facilitates application of downward counter force for mold engagement to the die attach pad 110 during molding processing to combat over mold occurrences during device fabrication.

The electronic device 100 in FIGS. 1-1C also includes conductive metal leads 116. In the illustrated example, moreover, the leads 116 have a down set form or structure or shape, with internal portions elevated higher than externally exposed portions (FIGS. 1, 1A and 1B). The down set lead structure provides mold locking features that mitigate or prevent mold delamination and mitigate relative movement of the leads 116 relative to the molded package structure 108 when external forces may be applied to the leads 116, such as during soldering of the leads 116 to conductive pads of a host circuit board (not shown). Reducing lead movement beneficially reduces stress on electrical connections of the leads 116 to other circuit nodes in the electronic device 100, such as bond wire connections to the tops or sides of the respective leads 116.

The electronic device 100 includes a semiconductor die 120 attached to the second side 112 of the die attach pad 110. As best shown in FIGS. 1B and 1C, a bottom side of the semiconductor die 120 is mounted on the second (e.g., top) side 112 of the die attach pad 110 by an adhesive 121. In one example, the adhesive is an electrically and thermally conductive material to allow electrical connection of the bottom side of the semiconductor die 120 to the die attach pad 110 and to facilitate thermal transfer of heat generated in the semiconductor die 120 through the die attach pad 110. In another example, the adhesive 121 is or includes a thermally conductive electrical insulator material to provide electrical isolation of the semiconductor die 120 from the die attach pad 110. Other examples may include more than one semiconductor die and may have more than one die attach pad (not shown) that may be exposed outside the molded package structure 108. In the above or other examples, the electronic device 100 can include one or more passive circuit components (not shown) connected with the semiconductor die 120 and/or leads 116 to form an integrated circuit.

Conductive features (e.g., copper or aluminum bond pads or pillars) of the semiconductor die 120 are connected to respective leads 116 by bond wires 122. In the illustrated example, a wire bond connection is made to the tops of respective ones of the leads 116, and the bond wires 122 have second bonds to respective bond pads of the semiconductor die. In one example, the semiconductor die 120 includes a single transistor (e.g., a field effect transistor (FET), a bipolar transistor, an insulated gate bipolar transistor (IGBT), etc.) and the bond wires 122 make electrical connections to specific leads 116 for transistor terminals (e.g., control terminal (transistor base or gate), emitter, collector, source, drain, back gate, substrate, etc.). In another example, different electrical connection technologies can be used, such as flip chip soldered connections, substrates or routing structures, combinations thereof, etc. In other implementations, the electronic device has only a single externally exposed lead 116 (e.g., along one of the lateral sides 103 or 104) and the transistor connections are made by soldering the lead 116 and two or more die attach pads to a host circuit board (not shown).

As best shown in FIGS. 1 and 1A the individual leads 116 have an upper first portion 118 and a lower second portion. The first portions 118 of the leads 116 are connected to a circuit of the semiconductor die 120 by a corresponding bond wire 122. In this example, a first lead 116 has a second portion exposed along the third side 103 of the package structure 108 and the lower second portion has a bottom along the plane of the first side 111 of the die attach pad 110. The first portion 118 of the first lead 116 is spaced apart from the plane of the first side 111 of the die attach pad 110 to provide a mold locking feature and mitigate damage to the corresponding bond wire connection by limiting relative movement of the first lead 116 and the package structure 108. This enhances device reliability in production, soldering to a host circuit board (not shown) and during operation when the electronic device may be subjected to external forces that pull on the lead 116 such as shock or vibration of the electronic device 100 or a host system, and/or thermal cycling where coefficient of thermal expansion (CTE) mismatch between components or structures of the device 100 can lead to applied force. In the example of FIGS. 1 and 1B, the second lead 116 has a first portion 118 and a second portion, where the first portion 118 is connected to the circuit of the semiconductor die 120 by a second bond wire 122, and the second portion of the second lead 116 is exposed along the fourth side 104 of the package structure 108. The second portion of the second lead in this example has a bottom along the plane of the first side 111 of the die attach pad 110, and the first portion of the second lead 116 is spaced apart from the plane of the first side 111 of the die attach pad 110 to provide the above described benefits of mold locking features of the down set lead shape.

The package structure 108 in the illustrated example encloses all or a portion of the semiconductor die 120, the bond wires 122, and a portion of the second side 112 of the die attach pad 110, and the first side 101 of the package structure 108 exposes all or a portion of the first side 111 of the die attach pad 110, and the second portions of the leads 116. The leads 116 in this example have cut ends 117 formed by cutting operations during package separation and the ends 117 extend laterally outward from the respective third and fourth sides 103 and 104 of the package structure 108 along the first direction X as seen in FIGS. 1, 1A, and 1B. In the illustrated example, the molding operation creates generally planar surfaces along the sides 103 and 104 as well as the generally planar first and second sides 101 and 102 based on the structure of the upper mold half used in fabrication, whereas the package separation cutting forms the planar package structure sides 105 and 106 and the cut tie bar ends 115 (FIGS. 1, 1A and 1C) along the ends of the electronic device 100.

Figure 2:
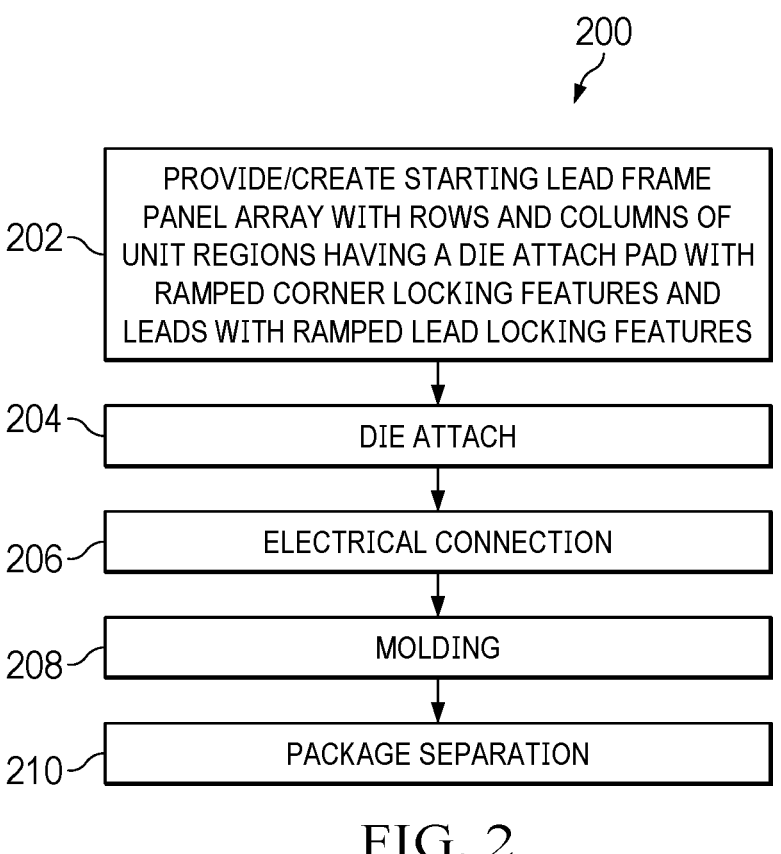
FIG. 2 is a flow diagram of a method of fabricating an electronic device.
Figure 3:
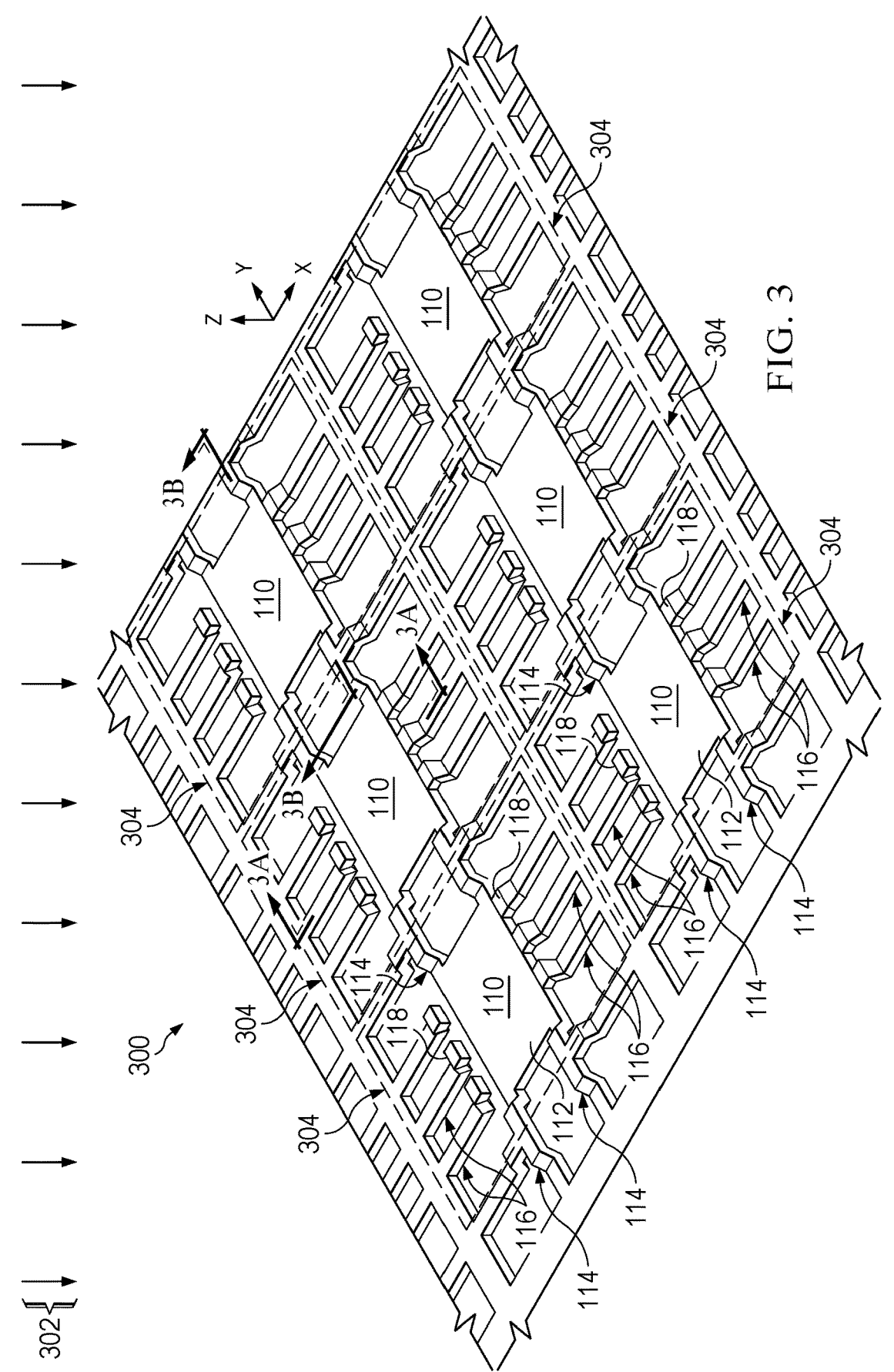
FIG. 3 is a partial top plan view of a lead frame panel array.
Figures 3A, 3B:
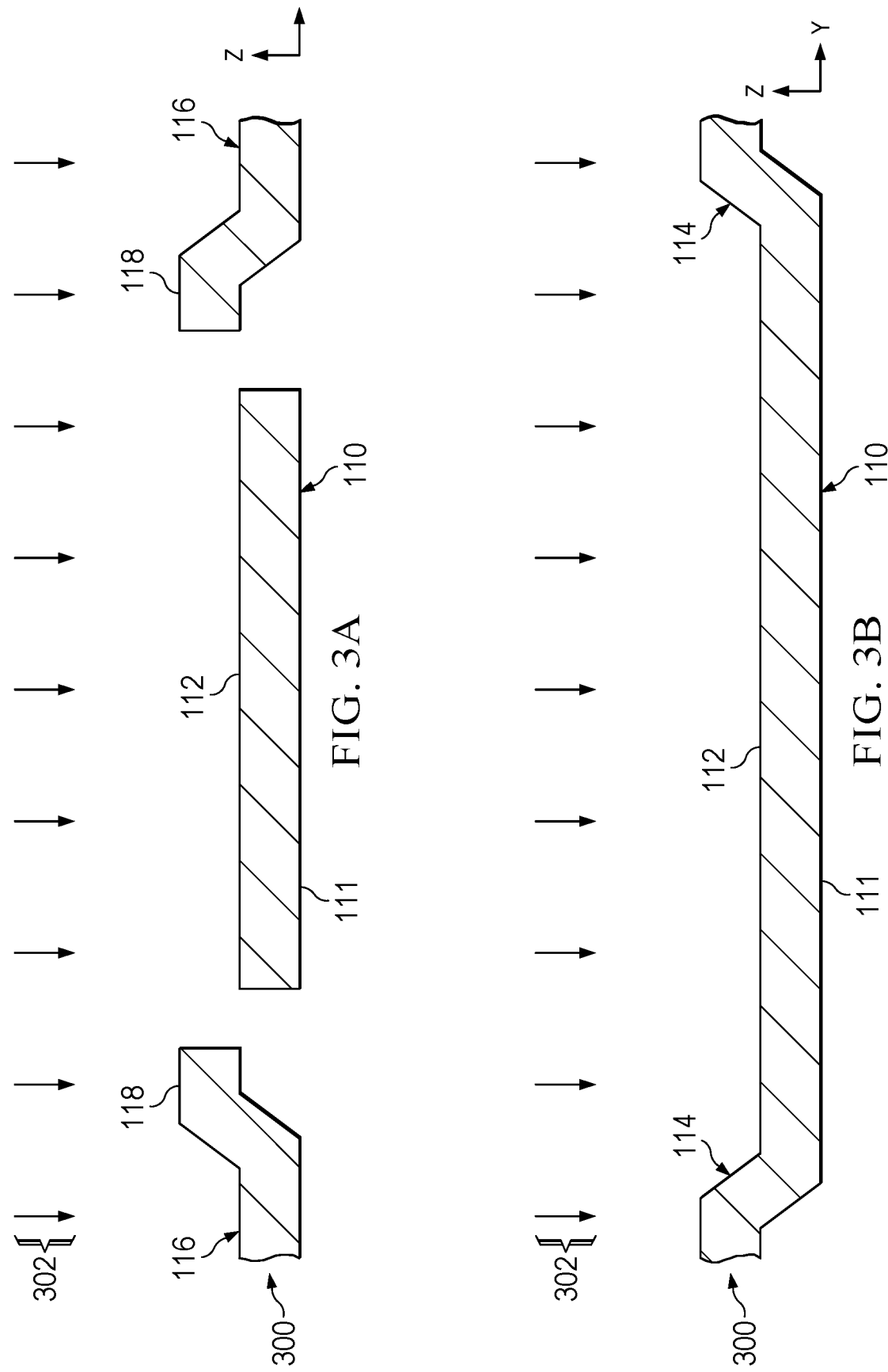
FIG. 3A is a partial sectional side elevation view taken along line 3A-3A of FIG. 3.
FIG. 3B is a partial sectional side elevation view taken along line 3B-3B of FIG. 3.

Referring also to FIGS. 2-7B, FIG. 2 shows a method 200 of fabricating an electronic device and FIGS. 3-7B show fabrication of the electronic device 100 of FIGS. 1-1C according to the method 200. The method 200 begins at 202 in FIG. 2 with providing or creating a starting lead frame panel array. FIGS. 3-3B show an example lead frame array 300, for example, a stamped and/or etched metal strip or panel structure that is or includes copper, aluminum or other conductive metal. FIG. 3 shows a partial top plan view of the lead frame panel array 300, FIG. 3A shows a partial sectional side elevation view taken along line 3A-3A of FIG. 3, and FIG. 3B shows a partial sectional side elevation view taken along line 3B-3B of FIG. 3. The strip or panel 300 is shown in FIGS. 3-3B undergoing a fabrication process 302, such as a stamping process that creates openings in a starting metal strip workpiece (not shown) and provides down set shapes or structures (e.g., for the tie bars 114 and leads 116) by stamping (e.g., bending) operations and/or by chemical etching. The example lead frame panel array 300 includes multiple unit regions 304 arranged in rows along the first direction X and columns along the second direction Y. The panel array structure 300 reduces cost by allowing concurrent packaging processing to fabricate multiple instances of the finished electronic device 100 illustrated and described above.

As best shown in FIG. 3, each unit region 304 in the example lead frame panel array 300 includes a die attach pad 110 with opposite ends spaced apart from one another along the second direction Y (e.g., also referred to as the column direction), two tie bars 114 connected to each end of the die attach pad 110 along the column direction Y, and one or more leads 116. The leads 116 of neighboring unit regions in adjacent columns are connected together by a connection bar that extends along the second direction Y between the columns of unit regions 304. In the illustrated example, each die attach pad 110 has opposite first and second sides 111 and 112, respectively. Each tie bar 114 in this example has a down set shape and extends away from the plane of the first sides 111 of the die attach pads 110 and the two tie bars 114 of neighboring unit regions 304 are joined together along the column direction Y. In addition, the tie bars 114 in the illustrated example extend outward from respective corners of the respective die attach pad 110, although not a requirement of all possible implementations. Each lead 116 in the lead frame panel array 300 has a first portion 118 and a second portion, where the first portion 118 is spaced apart from the plane of the first side 111 of the die attach pad 110, and the second portion has a bottom along the plane of the first side 111 of the die attach pad 110.

Figure 4:
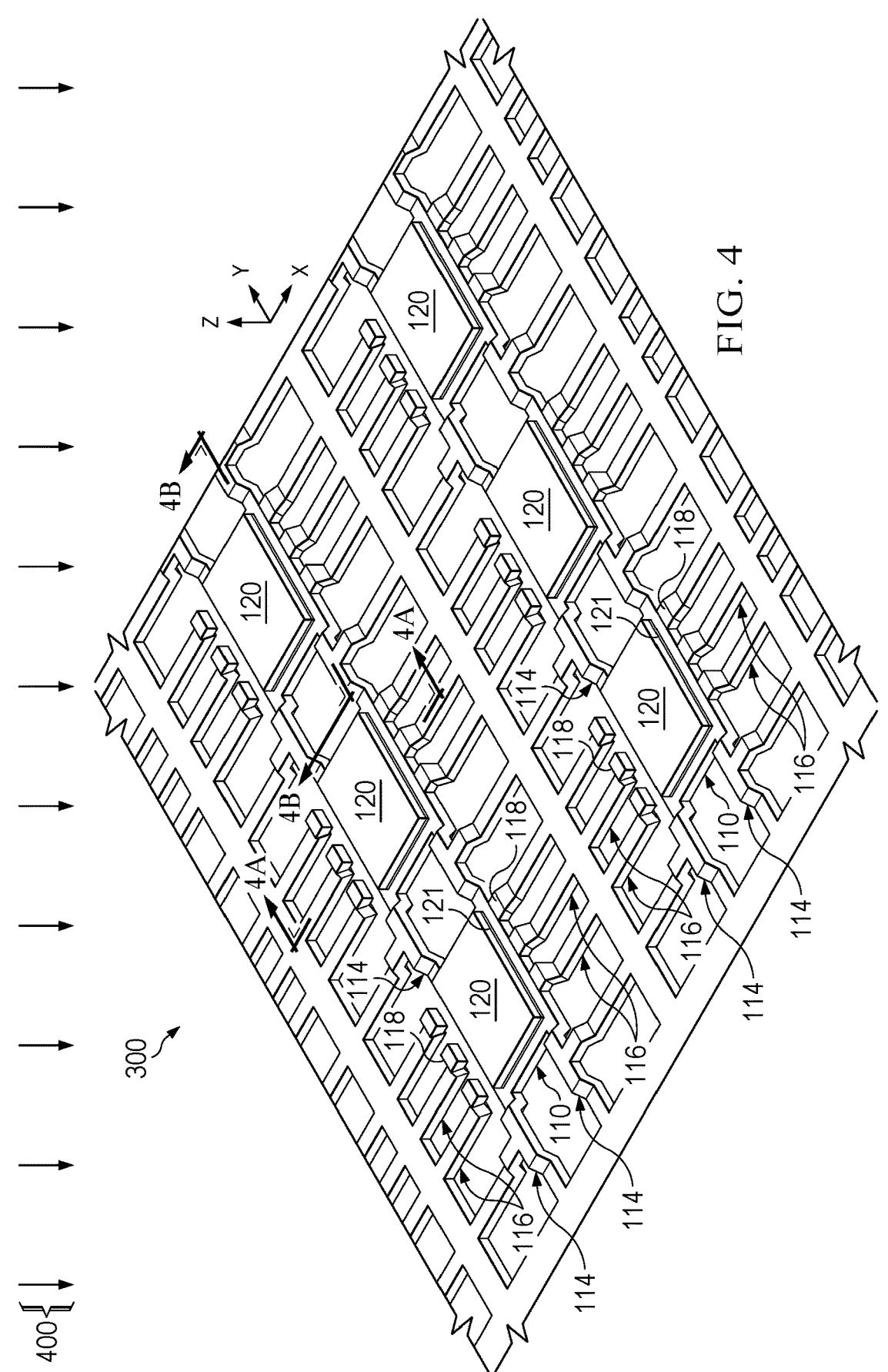
FIG. 4 is a partial top plan view of the lead frame panel array undergoing a die attach process.
Figures 4A, 4B:
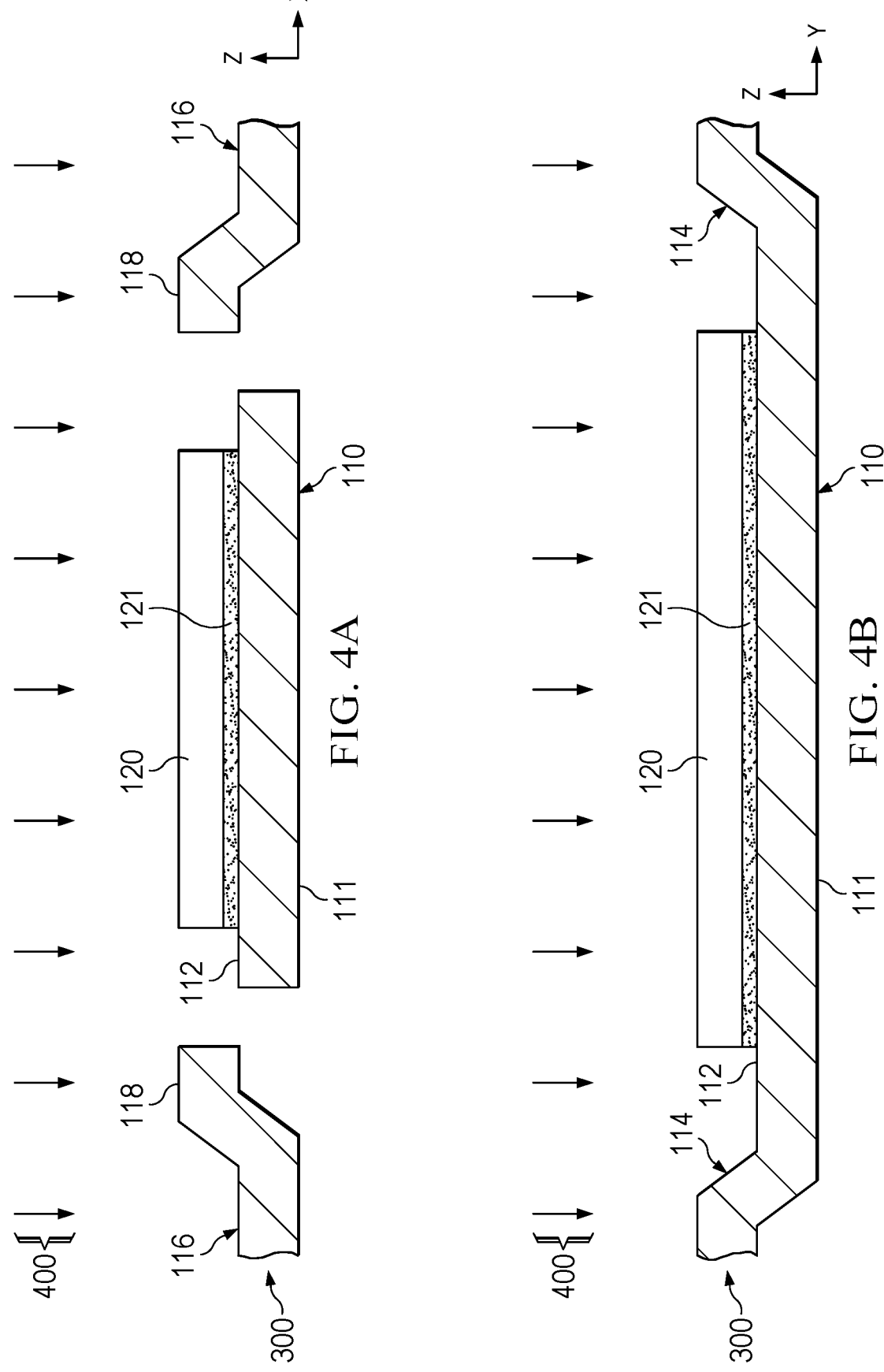
FIG. 4A is a partial sectional side elevation view taken along line 4A-4A of FIG. 4.
FIG. 4B is a partial sectional side elevation view taken along line 4B-4B of FIG. 4.

The method 200 includes die attach processing at 204 in FIG. 2. FIGS. 4-4B show one example, in which a die attach process 400 is performed that attaches a semiconductor die 120 to the die attach pad 110 of a given unit region 304 of the lead frame panel array 300. FIG. 4 shows a partial top plan view of the lead frame panel array 300 undergoing the die attach process 400, FIG. 4A shows a partial sectional side elevation view taken along line 4A-4A of FIG. 4, and FIG. 4B shows a partial sectional side elevation view taken along line 4B-4B of FIG. 4. In one example, the die attach process 400 includes attaching the bottom side of the semiconductor die 120 to the second side 112 of the die attach pad 110 in each unit region 304 by an adhesive 121, which can be an electrically and thermally conductive material in one example or can be a thermally conductive electrical insulator material in another example. In one implementation, the adhesive 121 is dispensed or otherwise deposited on select portions of the top sides 112 of the respective die attach pads, using a dispensing or printing process, and instances of the semiconductor die 120 are positioned on the adhesive 121 in the individual unit regions 304 using automated pick and place equipment (not shown) according to a program, followed by a thermal heating process to cure the die attach adhesive 121.

Figure 5:
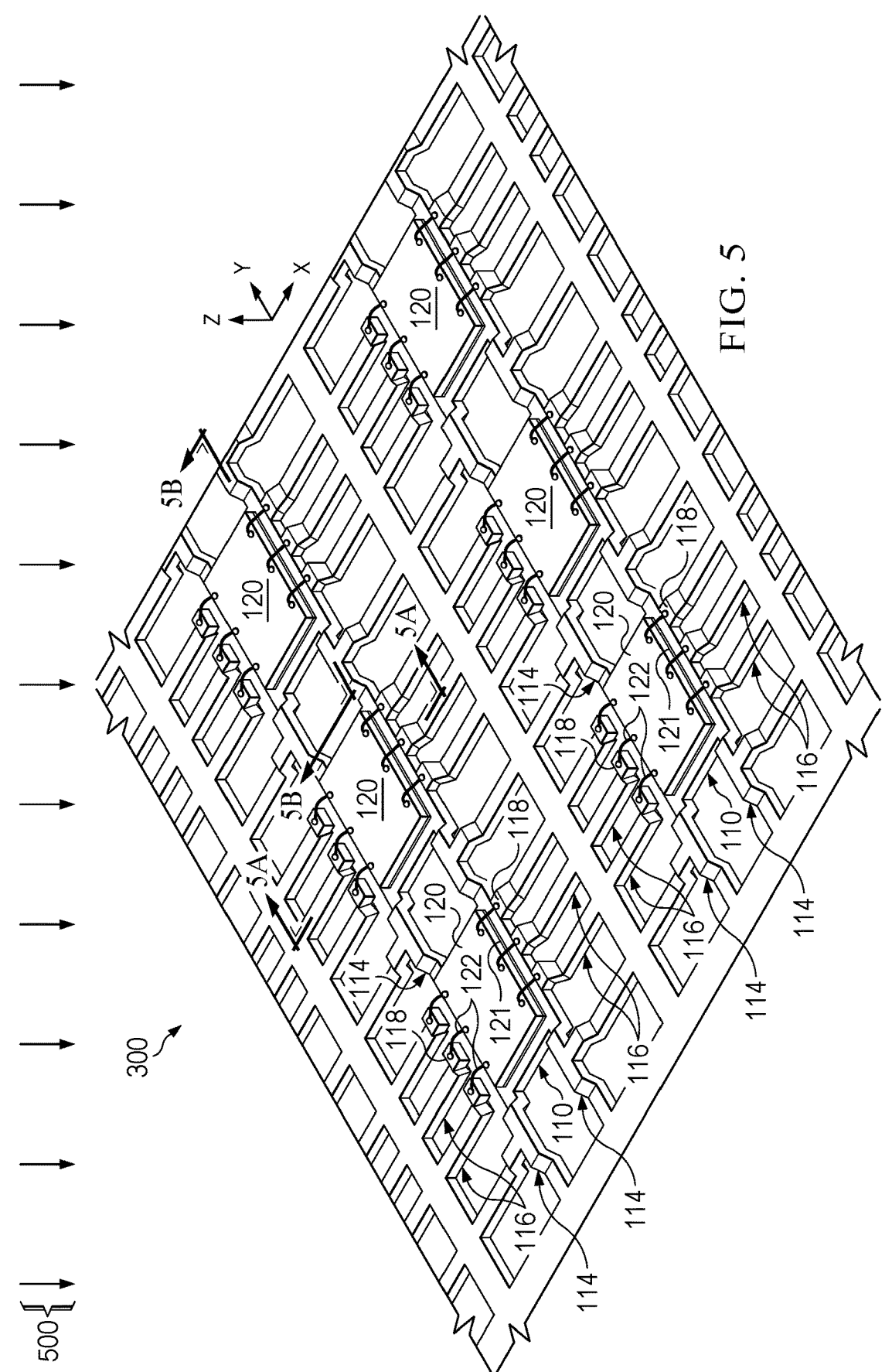
FIG. 5 is a partial top plan view of the lead frame panel array undergoing a wirebonding process.
Figures 5A, 5B:
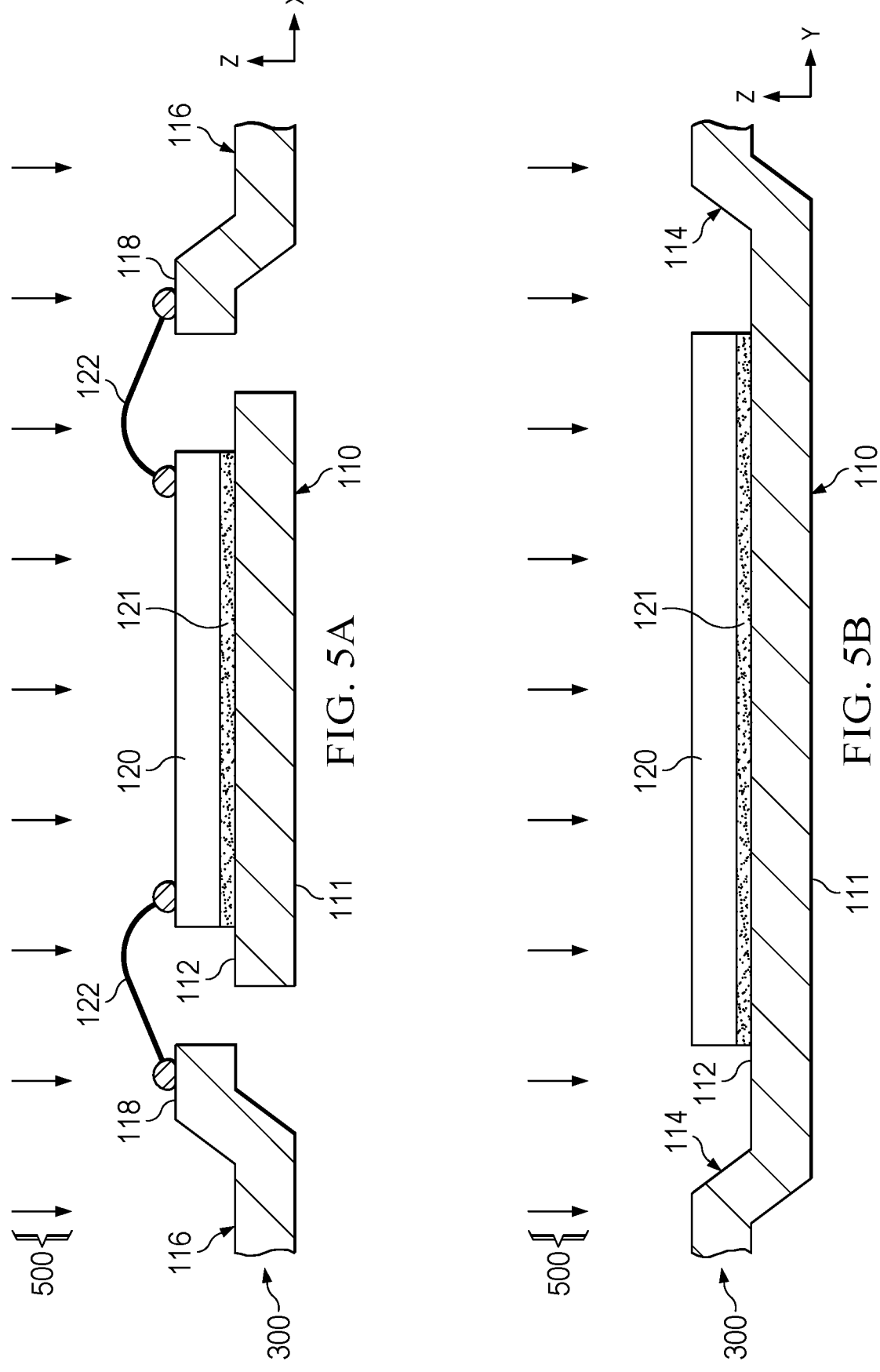
FIG. 5A is a partial sectional side elevation view taken along line 5A-5A of FIG. 5.
FIG. 5B is a partial sectional side elevation view taken along line 5B-5B of FIG. 5.

The method 200 continues at 206 in FIG. 2 with electrical connection processing. FIGS. 5-5B show one example, in which a wirebonding process 500 is performed that forms the bond wires 122 to provide electrical connection of a circuit of the semiconductor die 120 to the leads 116 of unit regions 304. FIG. 5 shows a partial top plan view of the lead frame panel array 300 undergoing the wirebonding process 500, FIG. 5A shows a partial sectional side elevation view taken along line 5A-5A of FIG. 5, and FIG. 5B shows a partial sectional side elevation view taken along line 5B-5B of FIG. 5. The process 500 in one example uses an automated wire bonder (not shown) that forms the bond wires 122 in each unit region 304 according to a program. In another implementation (not shown), flip-chip soldering is used for the die attach processing at 204 and the electrical connection processing at 206.

Figure 6:
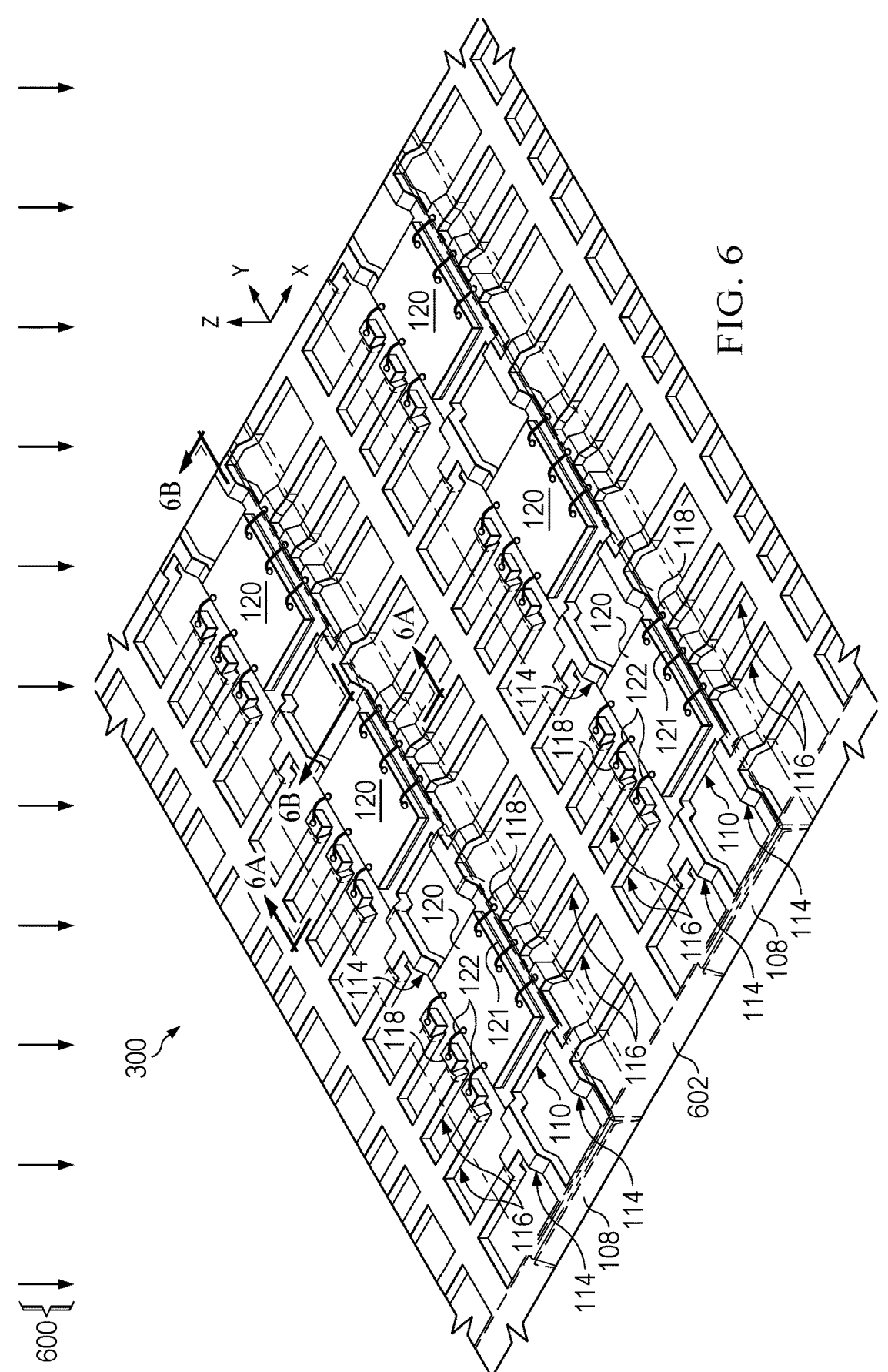
FIG. 6 is a partial top plan view of the lead frame panel array undergoing a molding process.
Figure 6A:
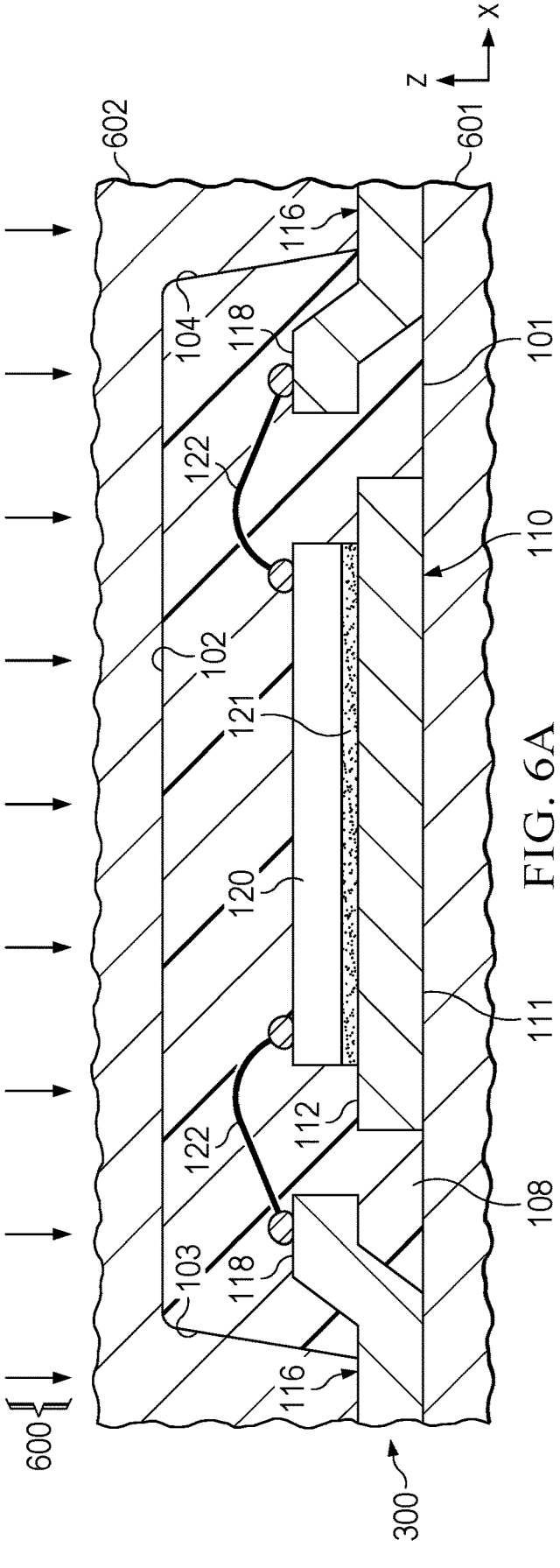
FIG. 6A is a partial sectional side elevation view taken along line 6A-6A of FIG. 6.
Figure 6B:
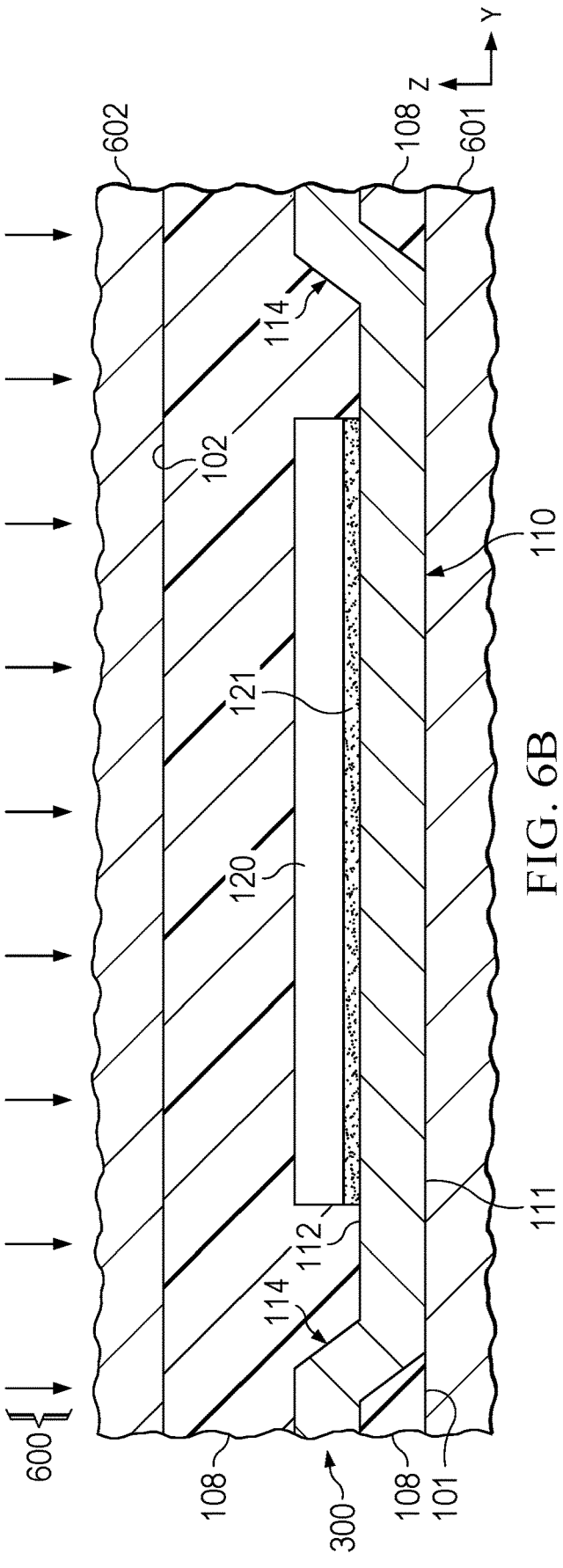
FIG. 6B is a partial sectional side elevation view taken along line 6B-6B of FIG. 6.

The method 200 continues with molding at 208 in FIG. 2. FIGS. 6-6B show one example, in which a molding process 600 is performed that forms molded structures 108 that enclose portions of the unit regions 304 along the columns of the array structure and exposes the bottom sides 111 of the die attach pads 110 of the unit regions 304. FIG. 6 shows a partial top plan view of the lead frame panel array 300 undergoing the molding process 600, FIG. 6A shows a partial sectional side elevation view taken along line 6A-6A of FIG. 6, and FIG. 6B shows a partial sectional side elevation view taken along line 6B-6B of FIG. 6. The molding process 600 in one example uses a lower or first mold structure 601 and an upper or second mold structure 602 with column-wise cavities that extend along multiple neighboring unit regions 304 of each column of the array structure. In one implementation, the molding process 600 incudes positioning the first mold structure 601 along the plane of the bottom side 111 of the die attach pad 110 to engage the bottom sides 111 of the die attach pads 110 (e.g., FIGS. 6A and 6B) and to engage bottoms of the leads 116 of the unit regions 304 of the lead frame panel array 300 (FIG. 6A). In this implementation, the molding process 600 also includes positioning the second (e.g., upper) mold structure 602 to engage the top sides of lower portions of the leads 116 and to provide a respective cavity (e.g., column cavities) that extend along the portions of the unit regions 304 along the columns. The process 600 also includes filling the mold cavities with molding compound to form the molded structures 108 as shown in FIGS. 6-6B.

Figure 7:
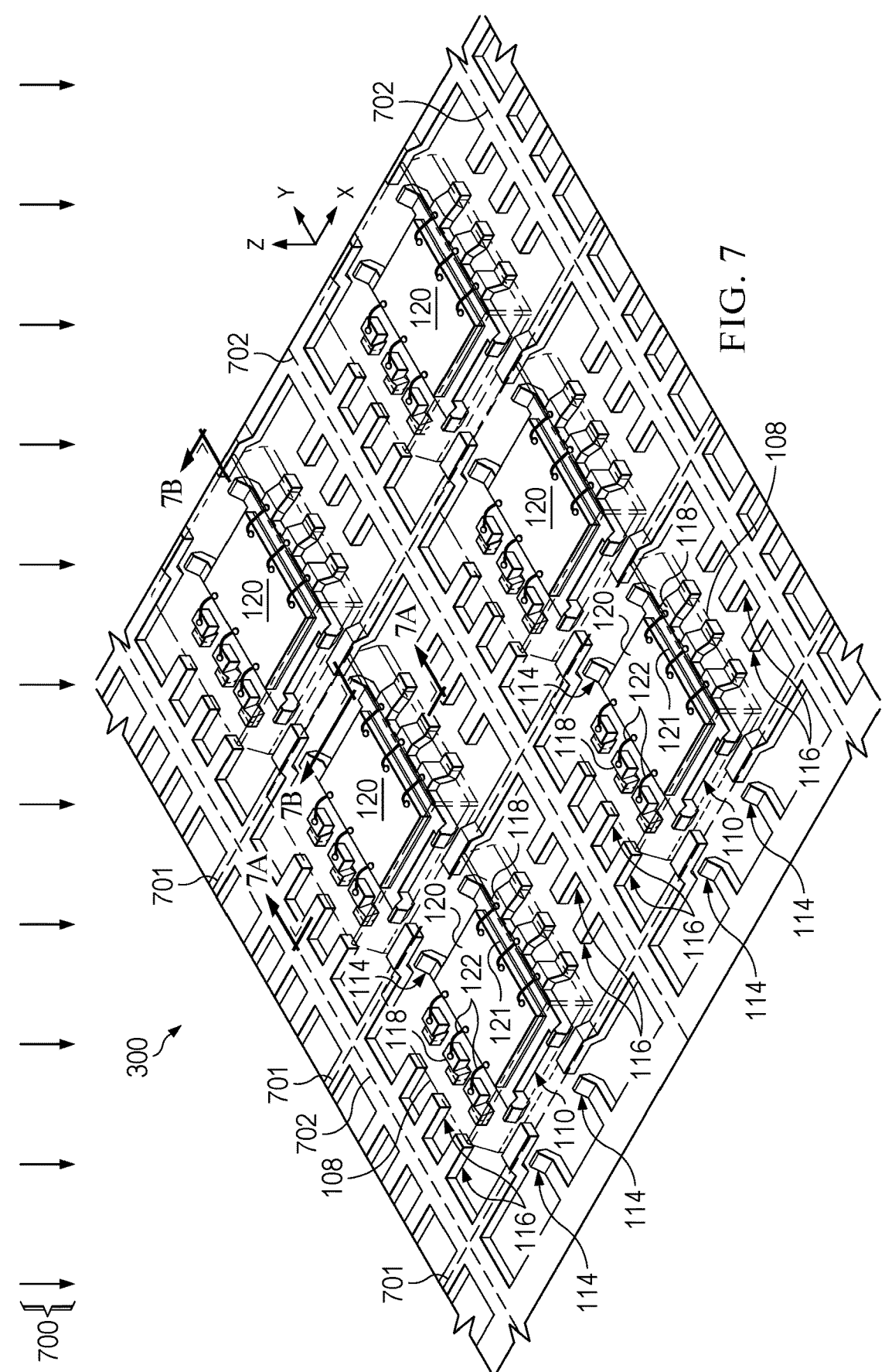
FIG. 7 is a partial top plan view of the lead frame panel array undergoing a package separation process.
Figure 7A:
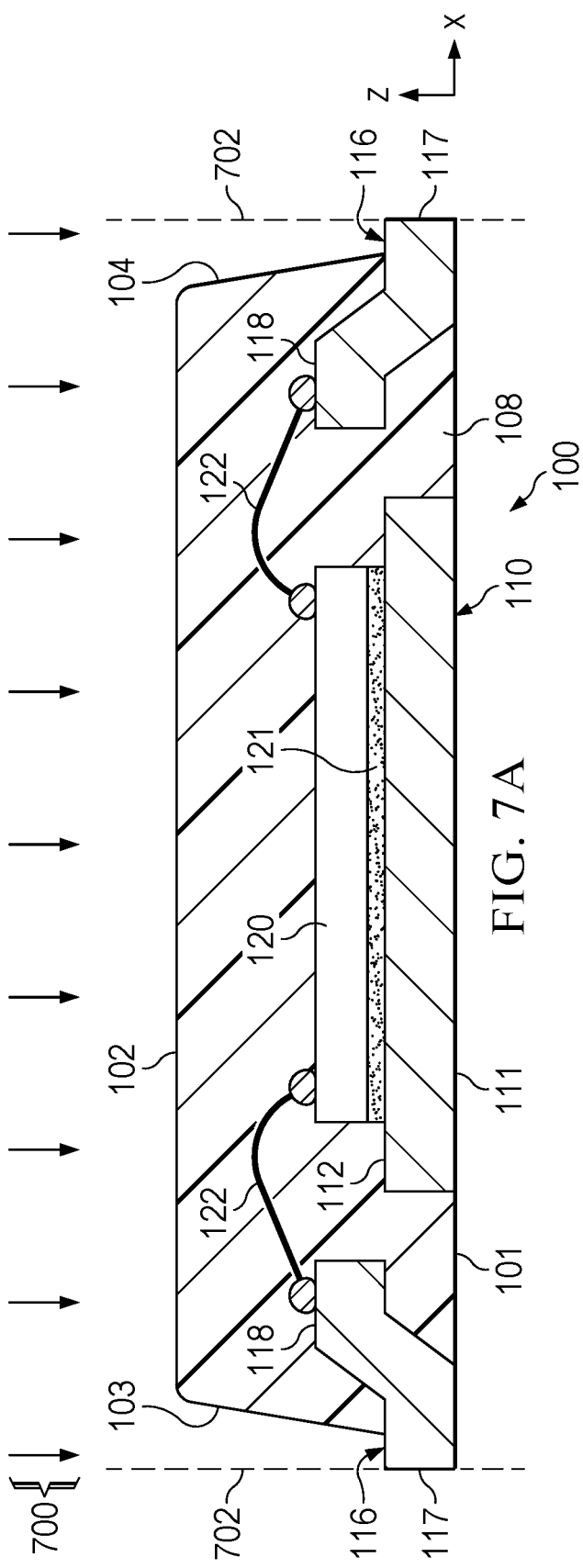
FIG. 7A is a partial sectional side elevation view taken along line 7A-7A of FIG. 7.
Figure 7B:
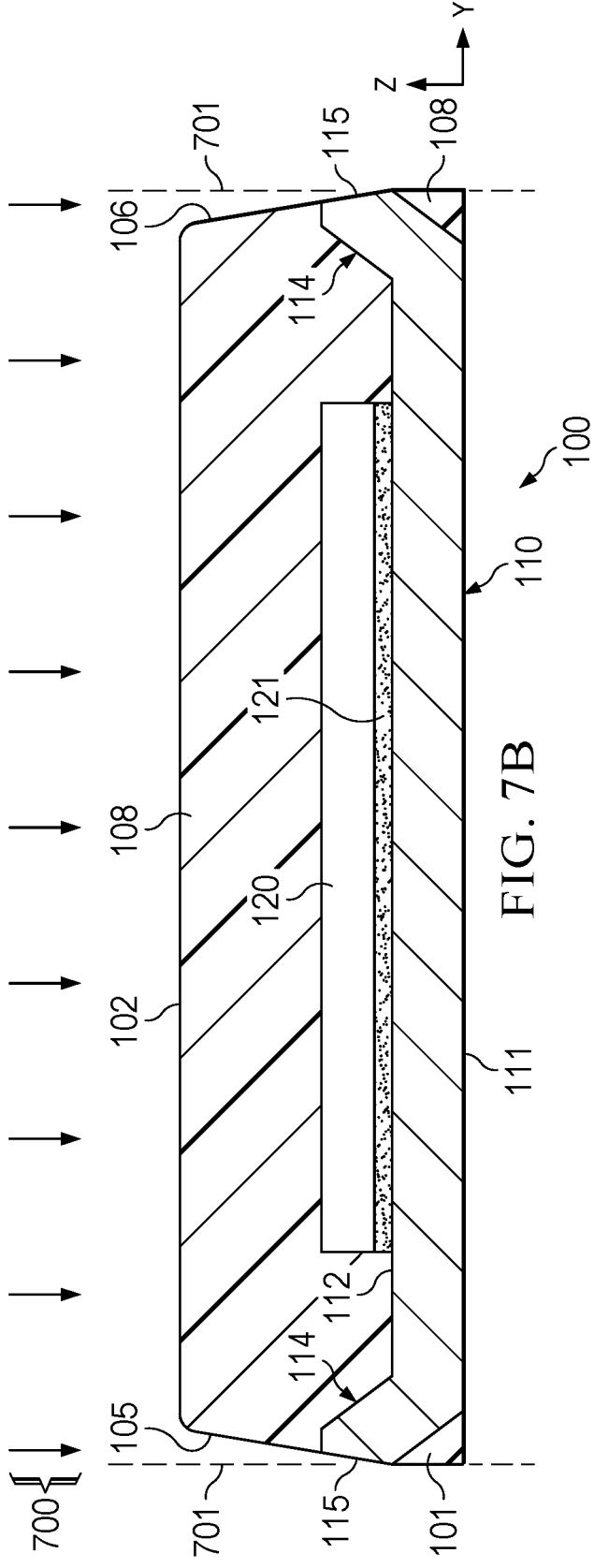
FIG. 7B is a partial sectional side elevation view taken along line 7B-7B of FIG. 7.

The method 200 continues at 210 in FIG. 2 with package separation. FIGS. 7-7B show one example, in which a package separation process 700 is performed using cutting operations by cutting saws or lasers that separates individual packaged electronic devices 100 from the lead frame panel array 300 to expose the cut ends 115 of the two tie bars 114 along opposite cut sides 105, 106 of the individual package structures 108, with the exposed cut ends 115 of the tie bars 114 spaced apart from the plane of the bottom side 111 of the die attach pad 110. FIG. 7 shows a partial top plan view of the lead frame panel array 300 undergoing the example package separation process 700, FIG. 7A shows a partial sectional side elevation view taken along line 7A-7A of FIG. 7, and FIG. 7B shows a partial sectional side elevation view taken along line 7B-7B of FIG. 7. In the illustrated implementation, the package separation process 700 includes performing a cutting process that cuts the molded structures 108 and the tie bars 114 along first cut lines 701 (FIGS. 7 and 7B) between the unit regions 304 of the columns to form the opposite cut sides 105, 106 of the package structures 108 and to expose the cut ends 115 of the tie bars 114. The package separation process 700 in this example also cuts the leads 116 of the unit regions 304 along second cut lines 702 (FIGS. 7 and 7A) that are parallel to the column direction Y and are spaced apart from the lateral third and fourth sides 103, 104 of the package structure 108.

The described examples provide electronic device, lead frame panel array and fabrication process solutions to improve or enhance thermal performance and reliability of small outline transistors and other packaged electronic devices with structural reliability enhancements and the capability to concurrently manufacture a high density array of devices with column-wise cavity molding for reduced production cost and time. Disclosed examples can provide these and other benefits in particular implementations, such as the illustrated wire bonded SOT devices 100 as well as with other types and forms of packaged electronic devices. In these examples, moreover, the lead frame panel array 300 provides down set leads 116 with first portions 118 and down set tie bars 114 that can help reduce or eliminate over mold occurrences with the added benefits of mold locking features to enhance performance and reliability. These benefits can be further combined with the improved thermal performance aided by the exposed lower side 111 of the die attach pad 110 to further facilitate increased power density and/or reduced package sizes, particularly for SOT devices that can be operated and high frequencies and/or high voltages for communications systems, power switching circuits, industrial, automotive or other applications. In addition, the described solutions do not rely on expensive package materials and can be implemented using low cost processes, such as stamped lead frame panel manufacturing systems and techniques and high density packaging processing systems and methods with column-wise package molding. The positioning of the tie bars 114 at or near the die attach pad corners can additionally help maximize lead I/O usage and the down set bridge tie bar structure of the starting lead frame panel array 300 helps support the die attach pad 110 flat against the bottom mold chase of half during molding to mitigate over mold occurrences. In specific examples, the tie bar down set dimensions can be tailored to manage the exertion stress on the bottom mold half 601 to minimize mold flash. Moreover, the described lead frame panel arrays 300 can be made using any suitable process, such as etched and stamped technologies.

Modifications are possible in the described examples, and other implementations are possible, within the scope of the claims.

What is claimed is:

1. An electronic device, comprising:
a die attach pad having opposite first and second sides;
a semiconductor die attached to the second side of the die attach pad;
a lead having a first portion and a second portion, the first portion of the lead connected to a circuit of the semiconductor die by a bond wire;
a package structure having opposite first and second sides, the package structure enclosing the bond wire, a portion of the semiconductor die, and a portion of the second side of the die attach pad, and the first side of the package structure exposing a portion of the first side of the die attach pad, and the second portion of the lead; and
first, second, third, and fourth tie bars extending outward from the die attach pad and away from a plane of the first side of the die attach pad, the tie bars having respective ends exposed outside the package structure.

2. The electronic device of claim 1, wherein:
the package structure includes opposite third and fourth sides that are spaced apart from one another along a first direction;
the lead is a first lead, the second portion of the first lead is exposed along the third side of the package structure and has a bottom along the plane of the first side of the die attach pad, and the first portion of the first lead is spaced apart from the plane of the first side of the die attach pad; and the electronic device includes a second lead having a first portion and a second portion, the first portion of the second lead is connected to the circuit of the semiconductor die by a second bond wire, the second portion of the second lead is exposed along the fourth side of the package structure and has a bottom along the plane of the first side of the die attach pad, and the first portion of the second lead is spaced apart from the plane of the first side of the die attach pad.

3. The electronic device of claim 2, wherein:

the package structure includes opposite fifth and sixth sides that are spaced apart from one another along a second direction that is orthogonal to the first direction;

the first and second sides of the package structure are spaced apart from one another along a third direction that is orthogonal to the first and second directions;

the ends of the first and second tie bars are exposed along the fifth side of the package structure; and the ends of the third and fourth tie bars are exposed along the sixth side of the package structure.

4. The electronic device of claim 3, wherein:

the first and second tie bars extend outward from respective first and second corners of the die attach pad and toward the fifth side of the package structure along the second direction and away from the plane of the first side of the die attach pad; and the third and fourth tie bars extend outward from respective third and fourth corners of the die attach pad and toward the sixth side of the package structure along the second direction and away from the plane of the first side of the die attach pad.

5. The electronic device of claim 2, wherein the tie bars extend outward from respective corners of the die attach pad.

6. The electronic device of claim 2, wherein:

the second portion of the first lead extends outward from the third side of the package structure; and the second portion of the second lead extends outward from the fourth side of the package structure.

7. The electronic device of claim 1, wherein the tie bars extend outward from respective corners of the die attach pad.

8. The electronic device of claim 1, wherein the second portion of the lead extends outward from a side of the package structure.

9. The electronic device of claim 1, wherein the second portion of the lead has a bottom along the plane of the first side of the die attach pad.

10. The electronic device of claim 9, wherein the first portion of the lead is spaced apart from the plane of the first side of the die attach pad.

11. The electronic device of claim 1, wherein the first portion of the lead is spaced apart from the plane of the first side of the die attach pad.

12. The electronic device of claim 1, wherein the semiconductor die includes a single transistor and the electronic device is a small outline transistor.

13. An electronic device, comprising:

a die attach pad having opposite first and second sides;

a semiconductor die attached to the second side of the die attach pad;

a lead having a first portion and a second portion, the first portion of the lead connected to a circuit of the semiconductor die by a bond wire;

a package structure having opposite first and second sides, the package structure enclosing the bond wire, a portion of the semiconductor die, and a portion of the second side of the die attach pad, and the first side of the package structure exposing a portion of the first side of the die attach pad, and the second portion of the lead; and first, second, third, and fourth tie bars extending outward from the die attach pad, wherein the tie bars extend away from a plane of the first side of the die attach pad, the tie bars having respective ends exposed outside the package structure and the ends of the respective tie bars are spaced apart from the plane of the first side of the die attach pad.

14. A lead frame panel array, comprising:

unit regions arranged in rows along a first direction and columns along an orthogonal second direction, each unit region including a die attach pad with opposite ends, two tie bars connected to each end of the die attach pad along a column direction, and a lead;

each die attach pad having opposite first and second sides;

the two tie bars of neighboring unit regions joining together only the two neighboring unit regions; and each lead having a first portion and a second portion, the first portion spaced apart from a plane of the first side of the die attach pad, and the second portion having a bottom along the plane of the first side of the die attach pad.

15. The lead frame panel array of claim 14, wherein the tie bars extend outward from respective corners of the respective die attach pad.

16. The lead frame panel array of claim 14, wherein the tie bars extend away from the plane of the first side of the die attach pad.

17. An electronic device, comprising:

a die attach pad having opposite first and second sides;

a semiconductor die attached to the second side of the die attach pad;

a lead having a first portion and a second portion, the first portion of the lead connected to a circuit of the semiconductor die by a bond wire;

a package structure having opposite first and second sides, the package structure enclosing the bond wire, a portion of the semiconductor die, and a portion of the second side of the die attach pad, and the first side of the package structure exposing a portion of the first side of the die attach pad, and the second portion of the lead; and tie bars extending outward from the die attach pad and away from a plane of the first side of the die attach pad, the tie bars having respective ends exposed outside the package structure.

18. The electronic device of claim 17, wherein:

the package structure includes opposite third and fourth sides that are spaced apart from one another along a first direction;

the lead is a first lead, the second portion of the first lead is exposed along the third side of the package structure and has a bottom along the plane of the first side of the die attach pad, and the first portion of the first lead is spaced apart from the plane of the first side of the die attach pad; and the electronic device includes a second lead having a first portion and a second portion, the first portion of the second lead is connected to the circuit of the semiconductor die by a second bond wire, the second portion of the second lead is exposed along the fourth side of the package structure and has a bottom along the plane of the first side of the die attach pad, and the first portion of the second lead is spaced apart from the plane of the first side of the die attach pad.

19. The electronic device of claim 18, wherein:
the package structure includes opposite fifth and sixth sides that are spaced apart from one another along a second direction that is orthogonal to the first direction;
the first and second sides of the package structure are spaced apart from one another along a third direction that is orthogonal to the first and second directions;
the ends of first and second ones of the tie bars are exposed along the fifth side of the package structure; and
the ends of third and fourth ones of the tie bars are exposed along the sixth side of the package structure.

20. The electronic device of claim 19, wherein:
the first and second ones of the tie bars extend outward from respective first and second corners of the die attach pad and toward the fifth side of the package structure along the second direction and away from the plane of the first side of the die attach pad; and the third and fourth ones of the tie bars extend outward from respective third and fourth corners of the die attach pad and toward the sixth side of the package structure along the second direction and away from the plane of the first side of the die attach pad.

21. The electronic device of claim 19, wherein the tie bars extend outward from respective corners of the die attach pad at a non-zero angle to the second direction.

22. The electronic device of claim 19, wherein one or more of the tie bars extend from a respective end of the die attach pad to a respective side of the package structure at a non-zero angle to the second direction.

23. The electronic device of claim 18, wherein:
the second portion of the first lead extends outward from the third side of the package structure; and
the second portion of the second lead extends outward from the fourth side of the package structure.

24. The electronic device of claim 17, wherein the tie bars have a down set structure or shape with respect to the die attach pad.

25. The electronic device of claim 17, wherein only a portion of the tie bars extend away from a plane of the first side of the die attach pad.

* * * * *